US009475963B2

(12) United States Patent
Liang et al.

(10) Patent No.: US 9,475,963 B2
(45) Date of Patent: Oct. 25, 2016

(54) FIXED ARRAY ACFS WITH MULTI-TIER PARTIALLY EMBEDDED PARTICLE MORPHOLOGY AND THEIR MANUFACTURING PROCESSES

(71) Applicant: Trillion Science Inc., Fremont, CA (US)

(72) Inventors: Rong-Chang Liang, Cupertino, CA (US); Jane Sun, San Jose, CA (US); Howard Ho Man Chu, Fremont, CA (US); Meng-Chun Lee, Emeryville, CA (US)

(73) Assignee: TRILLION SCIENCE, INC., Fremont, CA (US)

( * ) Notice: Subject to any disclaimer, the term of this patent is extended or adjusted under 35 U.S.C. 154(b) by 0 days.

(21) Appl. No.: 14/712,093

(22) Filed: May 14, 2015

(65) Prior Publication Data

US 2015/0240130 A1    Aug. 27, 2015

Related U.S. Application Data

(63) Continuation-in-part of application No. 13/678,935, filed on Nov. 16, 2012, and a continuation-in-part of application No. 13/233,360, filed on Sep. 15, 2011, now Pat. No. 9,102,851.

(51) Int. Cl.
    *C09J 9/02*    (2006.01)
    *C09J 7/02*    (2006.01)
    (Continued)

(52) U.S. Cl.
    CPC .. *C09J 9/02* (2013.01); *C09J 7/02* (2013.01); *C08K 7/04* (2013.01); *C08K 7/16* (2013.01);
    (Continued)

(58) Field of Classification Search
    CPC ........ C09J 9/02; C09J 7/02; C09J 2205/102; C09J 2203/326; C09J 2201/602; H05K 3/323; C08K 2201/005; C08K 7/16; C08K 7/04; C08K 2201/001; Y10T 428/24893; Y10T 428/24; Y10T 428/24355; Y10T 428/24372
    USPC ......................................... 428/141, 143, 206
    See application file for complete search history.

(56) References Cited

U.S. PATENT DOCUMENTS

| 4,247,234 A | 1/1981 | Hoffman |
| 4,588,456 A | 5/1986 | Dery et al. |

(Continued)

FOREIGN PATENT DOCUMENTS

| CN | 1307625 | 8/2001 |
| CN | 101094901 | 12/2007 |

(Continued)

OTHER PUBLICATIONS

US, Non-Final Office Action; U.S. Appl. No. 14/282,590 (Oct. 7, 2015).

(Continued)

*Primary Examiner* — Nathan Van Sell
(74) *Attorney, Agent, or Firm* — Thompson Hine LLP

(57) ABSTRACT

An ACF comprising a substrate, a layer of an adhesive on the surface of the substrate, the adhesive optionally having conductive particles dispersed therein, at least one tier of conductive particles arranged in a non-random array, the tier being formed by transfer of conductive particles from a carrier belt having a stitching line to the surface of the adhesive layer wherein the portion of the tier corresponding to the stitching line is free of conductive particles, and the adhesive layer being overcoated with a second tier of conductive particles arranged in a non-random array at least in the area of the first tier corresponding to the stitching line. The tiers may be at the same or different depths within the adhesive layer. More than two tiers of conductive particles may be present in the ACF.

11 Claims, 5 Drawing Sheets

(51) Int. Cl.
  *C08K 7/04*  (2006.01)
  *C08K 7/14*  (2006.01)
  *H05K 3/32*  (2006.01)
  *C08K 7/16*  (2006.01)

(52) U.S. Cl.
  CPC ... *C08K 2201/001* (2013.01); *C08K 2201/005* (2013.01); *C09J 2201/602* (2013.01); *C09J 2203/326* (2013.01); *C09J 2205/102* (2013.01); *H05K 3/323* (2013.01); *Y10T 428/24* (2015.01); *Y10T 428/24893* (2015.01)

(56) References Cited

U.S. PATENT DOCUMENTS

| | | | |
|---|---|---|---|
| 4,606,962 A | 8/1986 | Reylek et al. | |
| 4,740,657 A | 4/1988 | Tsukagoshi et al. | |
| 4,877,761 A | 10/1989 | Chmlel et al. | |
| 5,087,494 A | 2/1992 | Calhoun et al. | |
| 5,136,359 A | 8/1992 | Takayama et al. | |
| 5,141,790 A | 8/1992 | Calhoun et al. | |
| 5,141,970 A | 8/1992 | McArdle et al. | |
| 5,162,087 A | 11/1992 | Fukuzawa et al. | |
| 5,163,837 A | 11/1992 | Rowlette | |
| 5,183,969 A | 2/1993 | Odashima | |
| 5,216,065 A | 6/1993 | Colyer et al. | |
| 5,219,462 A | 6/1993 | Bruxvoort et al. | |
| 5,262,226 A | 11/1993 | Yoshida | |
| 5,275,856 A | 1/1994 | Calhoun et al. | |
| 5,300,340 A | 4/1994 | Calhoun et al. | |
| 5,330,684 A | 7/1994 | Emori et al. | |
| 5,366,140 A | 11/1994 | Koskenmaki et al. | |
| 5,437,754 A | 8/1995 | Calhoun | |
| 5,438,223 A | 8/1995 | Higashi et al. | |
| 5,486,427 A | 1/1996 | Koskenmaki et al. | |
| 5,487,707 A | 1/1996 | Sharf et al. | |
| 5,522,962 A | 6/1996 | Koskenmaki et al. | |
| 5,533,447 A | 7/1996 | Johnson et al. | |
| 5,613,862 A | 3/1997 | Naylor | |
| 5,672,400 A | 9/1997 | Hansen et al. | |
| 5,769,996 A | 6/1998 | McArdle et al. | |
| 5,820,450 A | 10/1998 | Calhoun | |
| 5,839,188 A | 11/1998 | Pommer | |
| 5,851,644 A | 12/1998 | McArdle et al. | |
| 5,882,802 A | 3/1999 | Ostolski | |
| 5,916,641 A | 6/1999 | McArdle et al. | |
| 6,011,307 A | 1/2000 | Jiang et al. | |
| 6,020,059 A | 2/2000 | Yamada et al. | |
| 6,042,894 A | 3/2000 | Goto et al. | |
| 6,110,399 A | 8/2000 | McArdle et al. | |
| 6,120,946 A | 9/2000 | Johnson et al. | |
| 6,172,878 B1 | 1/2001 | Takabayashi et al. | |
| 6,180,226 B1 | 1/2001 | McArdle et al. | |
| 6,214,460 B1 | 4/2001 | Bluem | |
| 6,245,175 B1 | 6/2001 | Hotta et al. | |
| 6,274,508 B1 | 8/2001 | Jacobson et al. | |
| 6,281,038 B1 | 8/2001 | Jacobson et al. | |
| 6,328,844 B1 | 12/2001 | Watanabe et al. | |
| 6,332,786 B1 | 12/2001 | Suga et al. | |
| 6,352,775 B1 | 3/2002 | Sasaki et al. | |
| 6,402,876 B1 | 6/2002 | McArdle et al. | |
| 6,423,172 B1 | 7/2002 | McArdle et al. | |
| 6,461,956 B1 | 10/2002 | Hsuan et al. | |
| 6,555,408 B1 | 4/2003 | Jacobson et al. | |
| 6,566,744 B2 | 5/2003 | Gengel | |
| 6,592,783 B2 | 7/2003 | Kumakura et al. | |
| 6,632,532 B1 | 10/2003 | Yamada et al. | |
| 6,671,024 B1 | 12/2003 | Uchlyama | |
| 6,672,921 B1 | 1/2004 | Liang et al. | |
| 6,683,663 B1 | 1/2004 | Hadley et al. | |
| 6,751,008 B2 | 6/2004 | Liang et al. | |
| 6,770,369 B1 | 8/2004 | Oyamada et al. | |
| 6,784,953 B2 | 8/2004 | Liang et al. | |
| 6,788,452 B2 | 9/2004 | Liang et al. | |
| 6,833,943 B2 | 12/2004 | Liang et al. | |
| 6,834,612 B2 | 12/2004 | Chambers | |
| 6,878,435 B2 | 4/2005 | Paik et al. | |
| 6,884,833 B2 | 4/2005 | Chheang et al. | |
| 6,906,427 B2 | 6/2005 | Tanaka et al. | |
| 7,078,095 B2 | 7/2006 | Tam | |
| 7,081,675 B2 | 7/2006 | Yim et al. | |
| 7,291,393 B2 | 11/2007 | Wakiya et al. | |
| 7,410,698 B2 | 8/2008 | Ishida et al. | |
| 7,566,494 B2 | 7/2009 | Jun et al. | |
| 7,736,541 B2 | 6/2010 | Toshioka et al. | |
| 7,815,999 B2 | 10/2010 | Park et al. | |
| 7,846,547 B2 | 12/2010 | Konishi | |
| 7,901,768 B2 | 3/2011 | Kumakura | |
| 7,923,488 B2 | 4/2011 | Xu et al. | |
| 7,931,956 B2 | 4/2011 | Fujita | |
| 7,976,658 B2 | 7/2011 | Zaretsky et al. | |
| 8,044,154 B2 | 10/2011 | McNamara et al. | |
| 8,067,484 B2 | 11/2011 | Ying et al. | |
| 8,084,083 B2 | 12/2011 | Otani et al. | |
| 8,084,553 B2 | 12/2011 | Liang et al. | |
| 8,247,701 B2 | 8/2012 | Usui et al. | |
| 8,399,982 B2 | 3/2013 | Wyland | |
| 2001/0008169 A1 | 7/2001 | Connell et al. | |
| 2002/0184754 A1 | 12/2002 | Yang | |
| 2005/0118845 A1 | 6/2005 | Kobayashi et al. | |
| 2006/0033213 A1 | 2/2006 | Yim et al. | |
| 2006/0054867 A1 | 3/2006 | Yamada | |
| 2006/0263581 A1 | 11/2006 | Park et al. | |
| 2006/0280912 A1 | 12/2006 | Liang et al. | |
| 2007/0175579 A1 | 8/2007 | Otani et al. | |
| 2007/0212521 A1 | 9/2007 | Bessho et al. | |
| 2008/0164812 A1 | 7/2008 | Tsai et al. | |
| 2008/0191174 A1 | 8/2008 | Ehrensvard et al. | |
| 2009/0053859 A1 | 2/2009 | Xu et al. | |
| 2009/0090545 A1 | 4/2009 | Usui et al. | |
| 2009/0181165 A1 | 7/2009 | Liang et al. | |
| 2010/0101700 A1 | 4/2010 | Liang et al. | |
| 2010/0317545 A1 | 12/2010 | McNamara et al. | |
| 2010/0327237 A1 | 12/2010 | Takai et al. | |
| 2011/0079799 A1 | 4/2011 | Lee et al. | |
| 2011/0114256 A1 | 5/2011 | Otani et al. | |
| 2011/0220401 A1 | 9/2011 | Ying et al. | |
| 2011/0253943 A1 | 10/2011 | Liang et al. | |
| 2012/0007259 A1 | 1/2012 | Ying et al. | |
| 2012/0029116 A1 | 2/2012 | Liang et al. | |
| 2012/0295098 A1 | 11/2012 | Hwang et al. | |
| 2013/0071636 A1 | 3/2013 | Liang et al. | |
| 2013/0154095 A1 | 6/2013 | Yu et al. | |
| 2015/0108436 A1 | 4/2015 | Min et al. | |

FOREIGN PATENT DOCUMENTS

| | | |
|---|---|---|
| EP | 0330452 | 8/1989 |
| EP | 1168373 | 1/2006 |
| JP | 63-91907 | 4/1988 |
| JP | 07-173667 | 7/1995 |
| JP | 2002-519473 | 7/2002 |
| JP | 2003-220669 | 8/2003 |
| JP | 2007-224111 | 9/2007 |
| JP | 2009-029862 | 2/2009 |
| JP | 2011-026539 | 2/2011 |
| KR | 10-0377603 | 11/2003 |
| WO | 00/00563 | 1/2000 |
| WO | 2007/130127 | 11/2007 |
| WO | 2007/130137 | 11/2007 |
| WO | 2014/078338 | 5/2014 |

OTHER PUBLICATIONS

US, Final Office Action; U.S. Appl. No. 13/678,935 (Oct. 8, 2015).
Office Action, U.S. Appl. No. 11/418,414 (Oct. 19, 2007).
Office Action, U.S. Appl. No. 11/418,414 (Apr. 30, 2008).
Office Action, U.S. Appl. No. 11/418,414 (Oct. 29, 2008).
Office Action, U.S. Appl. No. 11/418,414 (Apr. 30, 2009).
Office Action, U.S. Appl. No. 12/220,960 (Jun. 12, 2009).
Office Action, U.S. Appl. No. 12/608,955 (Aug. 16, 2013).
Office Action, U.S. Appl. No. 12/608,955 (Jan. 3, 2014).
Office Action, U.S. Appl. No. 13/233,360 (Mar. 14, 2014).
Notice of Allowance, U.S. Appl. No. 12/608,955 (Apr. 25, 2014).

(56) References Cited

OTHER PUBLICATIONS

Asai, S. et al. "Development of an Anisotropic Conductive Adhesive Film (ACAF) from Epoxy Resins," Journal of Applied Polymer Science, vol. 56, pp. 769-777, John Wiley & Sons, Inc. (1995).
Dokoutchaev, A. et al. "Colloidal Metal Deposition onto Functionalized Polystyrene Microspheres," Chem. Matter, vol. 11, pp. 2389-2399, American Chemical Society (1999).
Ishibashi, K. et al. "A New Anisotropic Conductive Film with Arrayed Conductive Particles," AMP Journal of Technology, vol. 5, pp. 24-30 (Jun. 1996).
Mescher, P. et al. "Applications Specific Flip Chip Packages; Considerations and Options in Using FCIP," Pan Pacific Microelectronics Symposium Conference (Jan. 2000).
Ugelstad, J. et al. "Biomedical Applications of Monodisperse Magnetic Polymer Particles," Future Directions in Polymer Colloids, El-ssser and Fitch (ed.), Martinus Nijhoff (pub.), p. 355 (1987).
Ugelstad, J. et al. "Preparation and Application of Monodisperse Polymer Particles," Journal of Polymer Science, vol. 72, pp. 225-240 (1985).
Ugelstad, J. et al. "Swelling of Oligomer-Polymer Particles. New Methods of Preparation of Emulsions and Polymer Dispersion," Advances in Colloid and Interface Science, Elsevier Scientific Publishing Company, Amsterdam, vol. 13, pp. 101-140 (1980).
Yamaguchi, M. et al. "Cupil-T Anisotropic Conductive Film for Testing," Nitto Giho, vol. 40, pp. 17-20 (Sep. 2002).
Office Action (with English translation), Taiwanese Application No. 095146567 (Sep. 26, 2013).
PCT, International Search Report and Written Opinion, International Application No. PCT/US2012/054375 (Jun. 24, 2013).
International Search Report, International Application No. PCT/US2006/042229 (mailed Jun. 17, 2008, published Nov. 15, 2007).
International Preliminary Report on Patentability, International Application No. PCT/US2006/042229 (Mar. 24, 2009).
International Search Report, International Application No. PCT/US2006/046807 (mailed Feb. 2, 2009, published Nov. 15, 2007).
International Preliminary Report on Patentability, International Application No. PCT/US2006/046807 (Mar. 30, 2009).
Notice of the Reason for Rejection (with English translation), Korean Application No. 2008-7028483 (May 27, 2013).
International Search Report and Written Opinion, International Application No. PCT/US2012/054375 (Jun. 24, 2013).
Liang, R-C. et al. "Fixed-Array Anisotropic Conductive Film (FACF) for Ultra Fine Pitch Applications," ICFPE Proceedings, Paper S1-2-4, Hsinchu, Taiwan (2010).
Liang, R-C. et al. "Ultra Fine Pitch Anisotropic Conductive Film with Fixed Array of Conductive Particles," IDW'10 Proceeding, p. 1909, Paper FMC4-4, Fukuoka, Japan (2010).
"Ultra-Fine Pitch Fixed Array ACF," Tech on Chinese (Mar. 1, 2011).
EP, Extended Search Report, European Application No. 06844998.2 (Jun. 14, 2012).
EP, Supplemental Search Report, European Application No. 06844998.2 (Feb. 20, 2012).
Nuzzo, R.G et al. "Absorption of Bifunctional Organic Disulfides on Gold Surfaces," J. Am. Chem. Soc., vol. 105, pp. 4481-4483 (1983).
Gendel, "A Process for the Manufacture of Cost Competitive MCM Substrates," MCM '94 Proceedings, pp. 182-187 (1994).
EP, Partial Search Report, European Application No. 13171999 (May 14, 2014).
Notice of the Reason for Rejection (with English translation), Korean Application No. 2010-7028483 (Nov. 28, 2013).
EP, Office Communication, European Application No. 06844998.2 (Feb. 2, 2012).
CN, English translation of TIPO's Search Report for ROC Patent Application No. 102141566 (Jan. 22, 2015).
PCT, International Search Report and Written Opinion, International Application No. PCT/US2013/069770 (Mar. 28, 2014).
El-Aasser M.S. et al.; "Future Directions in Polymer Colloids"; Martinus Nijhoff Publishers; Dordrecht, Boston; pp. 355-370 (1987).
Pukanszky, B. et al., "The possible mechanisms of polymer-filler interaction in polypropylene-$CaCO_3$ composites," *Journal of Materials Science Letters*, 8, pp. 1040-1042 (1989).
Kurth, D. G. et al., "Surface Reactions on Thin Layers of Silane Coupling Agents," *Langmuir*, 9, pp. 2965-2973 (1993).
Kakkar, A.K. et al., "Self-assembled chromophoric thin film NLO materials. Effect of coupling agent surface functionalization and ion exchange processes on second harmonic generation characteristics," *Thin Solid Films*, 242, pp. 142-145 (1994).
Demjén, Z. et al., "Effect of Surface Coverage of Silane Treated $CaCO_3$ on the Tensile Properties of Polypropylene Composites," *Polymer Composites*, vol. 18, No. 6, pp. 741-747 (Dec. 1997).
Pleuddemann, E.P. (ed); "Silane Coupling Agents"; Plenum Press, New York; pp. 182-193 and 200-205 (1991).
US, Non-Final Office Action; U.S. Appl. No. 13/678,935 (Aug. 27, 2014).
US, Non-Final Office Action; U.S. Appl. No. 13/678,935 (Apr. 21, 2015).
TW, Office Action dated May 11, 2015 for Taiwanese Application No. 095146567 (with English translation).
US, Final Office Action issued in U.S. Appl. No. 13/233,360 (Nov. 6, 2014).
US, Notice of Allowance issued in U.S. Appl. No. 13/233,360 (Mar. 31, 2015).
US, Supplemental Notice of Allowability issued in U.S. Appl. No. 13/233,360 (May 21, 2015).
JP, Office Action, Japanese Application No. 2014-530713, dated Jul. 2, 2015.
PCT, International Search Report and Written Opinion; Application No. PCT/US2015/040297 (Oct. 13, 2015).
JP, English translation of Office Action issued in Japanese Patent Application No. 2014-530713; (Jan. 22, 2016).
CN, English translation of Second Office Action issued in Chinese Patent Application No. 201380045329.3; (May 26, 2016).
CN, First Office Action with English translation; Patent Application No. 201280044756.5 (Oct. 10, 2015).

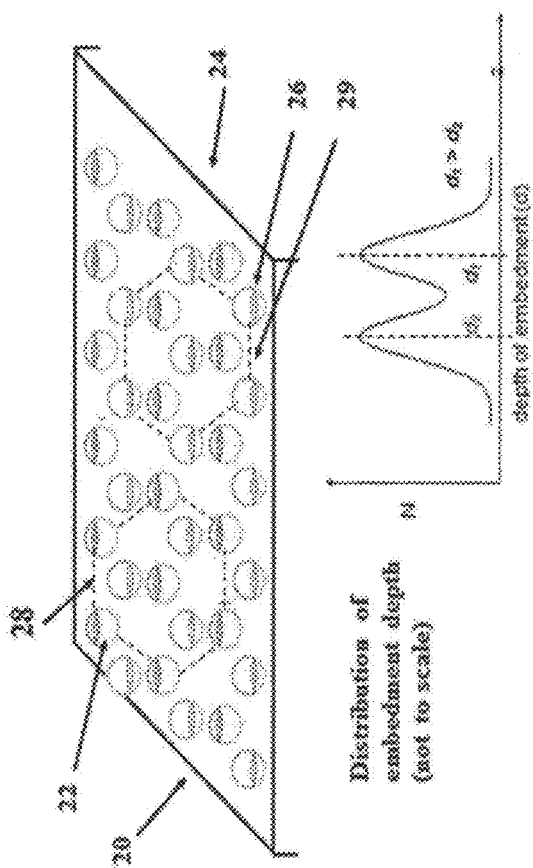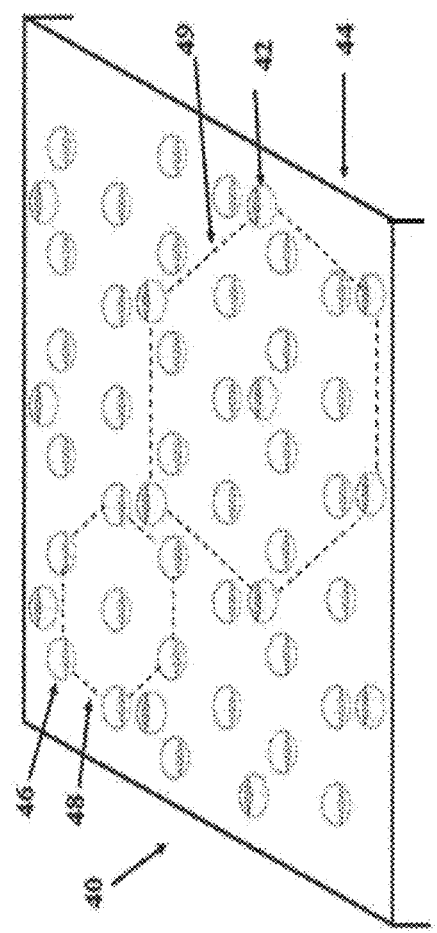
Figure 2
Figure 3

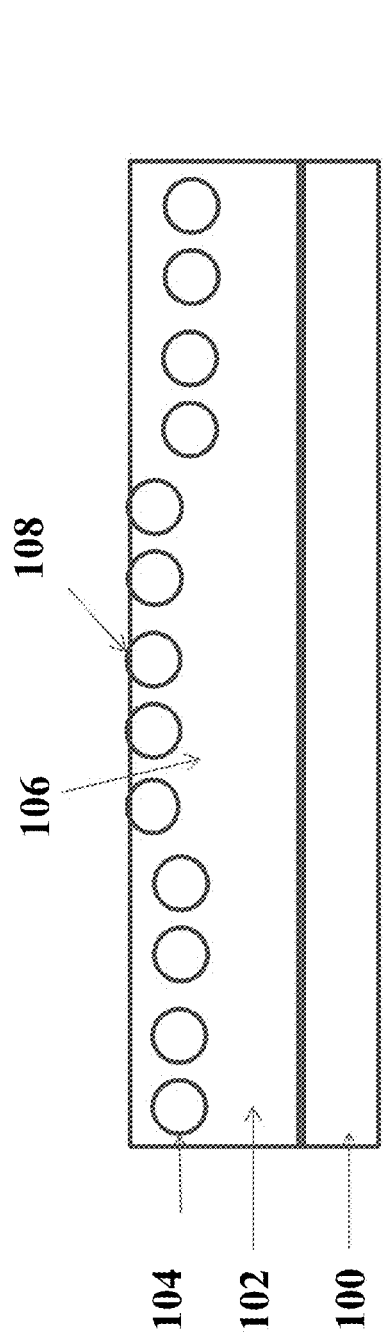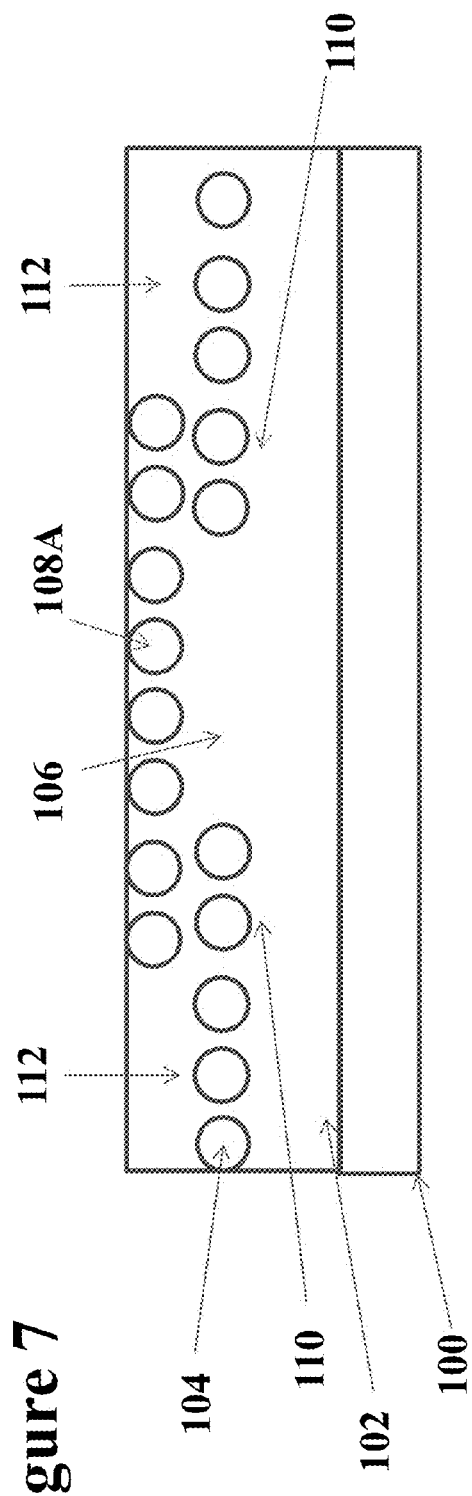

FIXED ARRAY ACFS WITH MULTI-TIER PARTIALLY EMBEDDED PARTICLE MORPHOLOGY AND THEIR MANUFACTURING PROCESSES

CROSS-REFERENCE TO RELATED APPLICATIONS

This application is a combined continuation-in-part of U.S. application Ser. No. 13/678,935 filed Nov. 16, 2012 (TS-023) and allowed U.S. application Ser. No. 13/233,360 filed Sep. 15, 2011 (TS-011). Both applications are incorporated herein by reference in their entireties.

BACKGROUND

Anisotropic Conductive Films (ACF) are commonly used in flat panel display driver integrated circuit (IC) bonding. A typical ACF bonding process comprises a first step in which the ACF is attached onto the electrodes of the panel glass; a second step in which the driver IC bonding pads are aligned with the panel electrodes; and a third step in which pressure and heat are applied to the bonding pads to melt and cure the ACF. The conductive particles of the ACF provide anisotropic electrical conductivity between the panel electrodes and the driver IC. ACF has also been used widely in applications such as flip chip bonding and photovoltaic module assembly.

U.S. Published Application 2010/0101700 to Liang et al. ("Liang '700") discloses a technique which overcomes some of the shortcomings of ACF having randomly dispersed conductive particles. Liang discloses that conductive particles are arranged in pre-determined array patterns in fixed-array ACF (FACF). Such a non-random array of conductive particles is capable of ultra fine pitch bonding without the same likelihood of a short circuit. In contrast, the conductive particles of fixed array ACFs are pre-arranged on the adhesive surface and have shown a significantly higher particle capture rate with a lower particle concentration than traditional ACFs. Since the conductive particles are typically high cost, narrowly dispersed Au particles with a polymer core, fixed array ACFs provide a significantly lower cost solution with a superior performance as compared to the traditional ones.

U.S. application Ser. No. 13/233,360 (recently allowed) discloses a process for manufacturing an ACF using a continuous belt or loop having an array of microcavities carrying conductive particles formed in one surface as the carrier web. The belt is used in a manner analogous to the web in the process disclosed in Liang '700. The belt is formed by abutting the end surfaces of a web and securing them with an adhesive such as pressure sensitive adhesive and UV or thermally curable adhesive. The abutted ends of the carrier web form a stitching line that may be at an oblique angle, i.e., less than 90° (as measured with respect to the longitudinal edges of the web). One problem with manufacturing an ACF using a continuous belt having a stitching line is that few, if any, conductive particles can be carried on the belt in the area of the stitching line because the microcavities are filled with adhesive in the area of the stitching line. In order to minimize the frequency with which an electrode (for example, an electrode in a device such as a microchip) oriented parallel the cross-machine direction of the ACF does not contact a sufficient number of conductive particles to complete a circuit the stitching line may be oriented at an oblique angle.

SUMMARY OF THE DISCLOSURE

The term "multi-tier" means two or more tiers of conductive particle arrays in which array(s) of conductive particles are partially or fully embedded in the surface of an ACF. The term "depth" refers to the portion of the conductive particle diameter that is below the top surface of the ACF adhesive. The particles may be completely and/or partially embedded in the adhesive layer. The term "corresponding to the stitching line" and variants thereof refer to that portion of the surface of the adhesive layer comprising the ACF which is characterized in that it contains no or very few conductive particles because it is formed by that portion of the carrier web at which the abutting ends of the carrier web are bonded (e.g., as disclosed in U.S. application Ser. No. 13/233,360). The microcavities in this portion of the carrier web are not well adapted to hold conductive particles. The stitching line interrupts the microcavity array on the belt and, in turn, the array of conductive particles on the surface of the ACF. If the stitching line is oriented at 90° to the belt, i.e. parallel the cross-machine direction of the belt, the array of conductive particles in an ACF made by transferring conductive particles from the belt will not include conductive particles in the area corresponding to the stitching line. However, by applying conductive particles to the area of the adhesive layer corresponding to the stitching line, the stitching line may be at any angle with respect to the machine direction of the substrate including a right angle as well as oblique angles. The implementation of the second transfer significantly improves the connect conductivity (reduced connect electrical resistance) in the stitching line area and improved the IC bonding yield rate. It also allows a wider tolerance in the stitching process. With the second transfer, high yields, particularly for high resolution IC bonding applications, can be achieved with a wide range of stitching line width and angles. Without the second transfer, a stitching line as narrow as the dimension of patterned electrodes (typically 10-1000 microns) or IC bump (typically 10-50 microns) would be required to minimize the missing conductive particles in the bonded area. However, for high resolution IC connections, a narrow stitching line in the range of IC bump size tends to result in a microcavity loop with a high-aspect-ratio trench having a depth or step height about the same as the substrate thickness (typically 50-150 microns). The small conductive particles (2-5 microns diameter) typically used to connect IC bumps to avoid a undesirable short tend to be trapped inside the deep trench and form aggregates during the microfluidic particle filling and transfer processes. An ACF with conductive particle aggregation will result in breaks or shorts in the electric circuit connections and is highly undesirable for any high resolution connections. The edges of the two stitching ends of the microcavity loop may be carefully polished and tapered to help reduce trapped particles and aggregates. However, the tapered edge approach tends to result in a significantly wider stitching line and potential damage of the microcavity array along the tapered lines. Both trade-offs will result in missing conductive particles and poor connectivity along the stitching line for high resolution applications. Alternatively, the trench may be filled with a durable adhesive such as UV or thermally cured adhesive. Unfortunately, filling and curing the adhesive into the narrow trench of high aspect ratio is an extremely difficult and time-consuming process. The surface smoothness and durability of the filled trench are often far from acceptable for the heavy duty microfluidic particle transfer process involved in the making of fixed array ACFs. There apparently is a need for a low cost structure and the manufacturing process thereof to produce ultra-fine pitch ACFs for high end IC applications.

This disclosure augments the fixed-array ACF of U.S. application Ser. No. 13/233,360 by providing an ACF in which the conductive particles are arranged in two or more tiers within the surface of the ACF conductive adhesive layer and the particle deficient area in the conductive layer which corresponds to the stitching line in one tier is overcoated with the conductive particles from at least one additional tier of conductive particles at a different depth in the adhesive layer. While U.S. application Ser. No. 13/111, 300 ("Liang '300") discloses that the conductive particles can be partially embedded in the adhesive resin such that at least a portion of the particle (e.g., about ⅓ to ¾ in diameter) is not covered by the adhesive, it has been found that this multi-tier array provides a further improvement in the particle capture rate and shows a lower contact resistance and a higher peeling force as compared with a fixed array ACF without the tiered particle structure.

The current disclosure includes ACF constructions in which one or more of these additional tiers is provided to apply conductive particles at least in the area of the first tier corresponding to the stitching line. One illustration of the multi-tier effect that is available using a two-tier non-random fixed array particle morphology as compared to a single plane morphology is shown in the following table:

TABLE 1

| | Average Particle density | Particle capture rate | Contact resistance @170 C/5 sec (ohm/electrode) | Peeling Strength @170 C/5 sec (Kgf/in) |
|---|---|---|---|---|
| Two-tier morphology | About 16000/mm² | 37.60% | 2.90 | 1.63 |
| Single plane morphology | About 17000/mm² | 34.40% | 3.56 | 1.16 |

It's evident from Table 1 that even though of a slightly lower particle density, the ACF having the two-tier particle morphology showed a significantly higher particle capture rate, and a better (lower) contact resistance and a higher peeling force while the other performance remained essentially the same. The two-tier particle morphology was also retained well after the samples were aged for more than 3 months under normal storage conditions. Not to be bound by the theory, it's believed that with some of the particles embedded into the adhesive more than the others in a given fixed array ACF, the effect of undesirable turbulence induced by melt flow of the adhesive during bonding is reduced and the local effective bonding pressure experienced on the contact particles increases. Both result in fewer particles being flushed out of the connecting electrodes and in turn a higher capture rate, a lower contact resistance and a higher adhesion strength. Moreover, for the same particle density, it's found that the ACFs with multi-tier structure produced by multiple particle transfer steps tend to show a more uniform particle distribution with a lower standard deviation of particle density and result in a higher success rate of the device bonding. Not to be bound by theory, it is believed that the probability of having missing particles in exactly the same spot of the particle array produced by two or more consecutive low-density (for example, using a particle array of 11.5 μm pitch for a particle density of about 9,000 pcs/mm²) the particle filling and transfer process is significantly lower than that of a single high-density array (for example, a particle array of 8 μm pitch for a particle density of about 18,000 pcs/mm²) particle transfer process. Even if some missing particle areas be produced in the first particle transfer process, particles can be effectively filled in those areas and transferred by the subsequent transfer process to form a multi-tier fixed array ACF with a low standard deviation of particle density.

In summary, in one manifestation of the invention, in any embodiment, the adhesive layer may have conductive particles dispersed therein in addition to the particles transferred to its surface in a non-random array. In other embodiments, the adhesive layer may not contain conductive particles dispersed therein. Additionally, the tier of conductive particles overcoating the area corresponding to the stitching line may overcoat only the area corresponding to the stitching line, or it may overcoat the stitching line and areas adjacent the area corresponding to the stitching line or it may overcoat all or a portion of the entire surface of the conductive adhesive layer.

One manifestation of the invention is an anisotropic conductive film (ACF) comprising: (a) an adhesive layer; and (b) a plurality of conductive particles that are individually adhered to the adhesive layer, wherein the conductive particles include first and second tiers of non-random arrays of particles embedded at first and second depths within the adhesive layer, wherein the depths at which the first array and the second array are embedded in the adhesive may be the same or may be different (e.g., about a 10% or more difference based on the diameter of the particle; for particles of 3 μm diameter, a difference of about 0.3 um or more). The difference in the embedded depths of the tiers can be as much as 20% or more, 30% or more, even as much as 80% or more of the particle diameter in depth and one of the tiers covers at least that portion of the first (e.g., deeper) tier of conductive particles in the adhesive layer corresponding to the stitching layers where otherwise there would be few or no conductive particles.

Thus, the disclosure provides an ACF including two or more fixed or non-random arrays of conductive particles embedded at one or more depths in the ACF wherein the particles in one tier overcoat at least the area corresponding to the stitching line in the other tier where, but for the overcoat, there would be no or few conductive particles due to the presence of the stitching line in the carrier belt. In a more particular embodiment, the adhesive layer itself contains conductive particles dispersed therein in addition to the particles transferred from the carrier belt. In another embodiment, the adhesive layer does not contain conductive particles dispersed therein. The combination of the adhesive layer containing the randomly dispersed conductive particles and the first tier of conductive particles arranged in a non-random array provides an ACF having a single tier of conductive particles in the area corresponding to the stitching line and two tiers of particles in the areas outside the area corresponding to the stitching line.

In another embodiment, the ACF may include two tiers of fixed or non-random arrays in which the conductive particles are partially embedded at the same or different depths in the surface of the adhesive layer of the ACF with the particles in one tier not being in the area of the stitching line and the particles in the other tier being at least in the area corresponding to the stitching line in the first tier. In this embodiment, the adhesive layer may optionally also contain conductive particles randomly dispersed therein.

In another embodiment, one tier is a fixed or non-random array of conductive particles embedded by transfer to the adhesive layer, and the second tier is a random dispersion of conductive particles dispersed in the adhesive layer on the surface of which the fixed or non-random array of particles is embedded. Other embodiments including additional tiers of arrays of particles such as a second and third tier are also possible.

Summarizing, the ACF is characterized in that it includes a first tier of conductive particles arranged in a non-random array deposited on the surface of an adhesive layer by transfer from a carrier belt including an area corresponding to a stitching line. The non-random array in this first tier does not contain or contains essentially no or few conductive particles in the area corresponding to the stitching line. To make the ACF suitable for use in ultra-fine pitch applications such as high resolution IC bonding, the particles are provided in the area corresponding to the stitching line by transfer as a second tier of conductive particles in a non-random array that is applied to the ACF at least in the area of the first tier corresponding to the stitching line. The first and second tiers respectively may be made up of particles that are the same size or different in size. The particles making up each tier may be at the same depth or different depths and they may have the same pitch of different pitches.

In a further embodiment of the invention to provide an ACF suitable for ultra-fine pitch applications, the ACF comprises a substrate, a layer of an adhesive optionally containing conductive particles randomly dispersed therein on the surface of the substrate, and one or more tiers of conductive particles arranged in non-random arrays and applied to the adhesive by transfer from a carrier belt including a stitching line. By locating or positioning the tiers so that the areas corresponding to the stitching lines in the respective tiers do not overlap, an ACF is provided that is suitable for ACF applications requiring a fine pitch.

Another manifestation of the invention is an anisotropic conductive film (ACF) comprising: (a) an adhesive layer having a substantially uniform thickness; and (b) a plurality of conductive particles individually adhered to the adhesive layer, wherein the conductive particles include a first non-random array of particles partially embedded at a first depth within the adhesive layer and a second non-random array of conductive particles partially embedded at a the same or a second depth within the adhesive layer wherein the second array covers the area of the stitching line in the first array.

It will be understood that a tier can be positioned to apply conductive particles only to the area corresponding to the stitching line in another tier or to an area that covers the stitching line as well as areas adjacent to the stitching line or covering the entire surface of the adhesive layer.

In accordance with one embodiment, a multi-tier ACF is made using a multiple transfer process including the steps of:

(a) transferring a first fixed array of particles to an adhesive layer except at the area corresponding to the stitching line;

(b) optionally processing the first array to the desirable degree of embedding using, for example, heating and/or a pressure roller or calendaring;

(c) transferring a second fixed array of particles to the adhesive at least over the area of the first array corresponding to the stitching line; and (d) optionally pressing both arrays of particles to the desired degree of embedding such that the first array is embedded in the adhesive to a greater extent than the second array.

In accordance with another embodiment, a multi-tier ACF is made using a multiple transfer process including the steps of:

(a) transferring a first fixed or non-random array of conductive particles except in the array of the stitching line to an ACF having a substrate coated with an adhesive having conductive particles dispersed therein; and (b) processing the first array to the desirable degree embedding using, for example, heating and/or a pressure roller or calendaring.

The ACF having a stitching line may be formed with a multi-tier particle morphology as described herein can be a sheet or a continuous film or a continuous film in the form of a reel or roll. In one embodiment the ACF may be supplied as a roll of about 1.0-2.0 mm (width) by about 10-300 meter (length) wrapped between a plastic holder. In another embodiment the ACF may be a continuous film or reel in which select areas have a multi-tier morphology as disclosed herein.

BRIEF DESCRIPTION OF THE DRAWINGS

FIG. 2 is schematic graphs of two fixed array ACFs having a two-tier particle morphology corresponding to FIG. 4 of U.S. application Ser. No. 13/678,935 filed Nov. 16, 2012 of the same pitch size having a two-tier particle morphology and the corresponding distribution of particle embedment depth.

FIG. 3 is a schematic of a two-tier fixed array ACF in which the microcavities employed for the transfer of the two tiers of fixed array particles have a different pitch size corresponding to FIG. 5 of U.S. application Ser. No. 13/678,935 filed Nov. 16, 2012.

FIG. 6 is a schematic cross-section of an ACF including a two tier structure of conductive particles in accordance with this disclosure wherein the second tier is restricted to the area of the stitching line.

FIG. 7 is a schematic cross-section of an ACF including a two tier structure of conductive particles in accordance with this disclosure wherein the second tier completely covers the area of the stitching line and overlaps with part of the first tier structure.

DETAILED DESCRIPTION

U.S. Published Application 2010/0101700 and U.S. application Ser. No. 13/111,300 filed May 19, 2011 to Liang et al. are also incorporated herein, in their entirety, by reference.

A carrier sheet or belt containing microcavities of about 6 µm (diameter) by about 4 µm (depth) by about 3 µm (partition) that is useful in transferring the conductive particles to the surface of the adhesive layer can be prepared by laser ablation on an approximately 2 to 5 mil heat-stabilized polyimide (PI) or polyester film such as PET to form the microcavity carrier. The microcavity array web is filled by coating with a conductive particle dispersion using for examples a smooth rod, doctor blade or slot die. More than one filling may be employed to assure no unfilled microcavities. See Liang '300 and Liang '700.

Figure 1A:
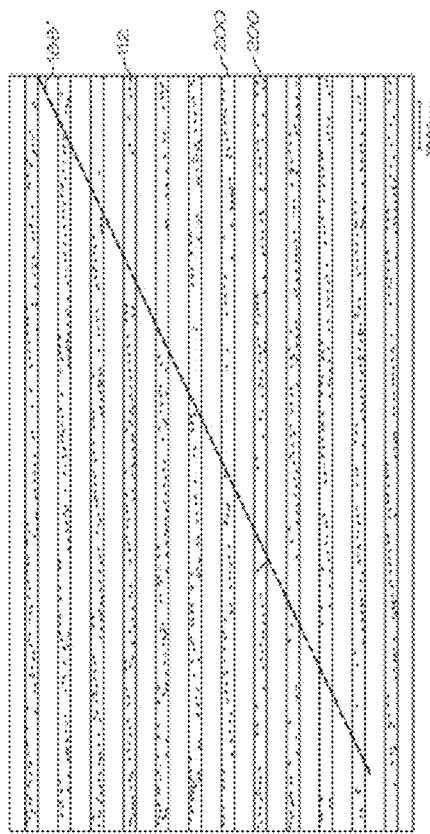
FIG. 1a is FIG. 8 of U.S. application Ser. No. 13/233,360 is a 400× photomicrograph of a bonded electronic device showing the distribution of conductive particles with respect to a series of 20 µm (width)×1000 µm (length) electrodes after bonded with an ACF having a 40 µm particle-free gap corresponding to a stitching line.

FIG. 1 is an illustration of a 400× photomicrograph of a bonded set of line electrodes of 18 μm (width)×1000 μm (length). The area 188' corresponds to a 60° stitching line with a 40 μm stitching gap that contains no conductive particles 112. In this particular example, the average diameter of the conductive particle is 3.2 μm and the distance or gap between particles across the stitching line is 80 μm measured along the electrode and represents less than 10 percent of the 1,000 μm stitching line length. There are about 58-60 particles contacting the electrodes crossing the stitching line as compared to about 64-66 particles contacting the electrodes not crossing the stitching line. The former is well above the minimum number of particles required to establish reliable electrical contact, which is generally about 5 to 10 particles per electrode. The absence of conductive particles in the oblique stitching line apparently has no impact on the connection for long and wide electrodes since more than enough conductive particles will still be captured. However, for high resolution IC chip bonding, the IC bump dimension is typically as small as 10-30 μm (width)×20-50 μm (length) corresponding a bump area of 300-1000 μm² or less. To achieve a high quality connection, at least 3-5 captured conductive particles are typically required on each bump.

Figure 1B:
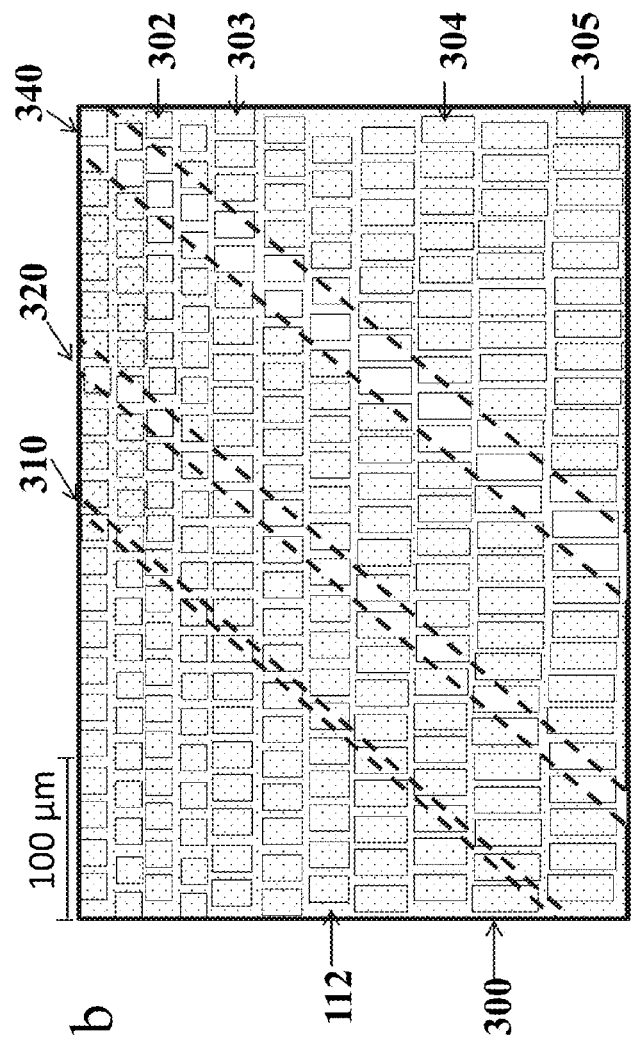
FIG. 1b is a schematic graph of a simulated test kit comprising series of IC bumps of a fixed 20 µm (width)×20-50 µm (length) bonded with a fixed array ACF having stitching lines of 10, 20 and 40 µm width.

FIG. 1b is a schematic illustration of a simulated test kit or film 300 comprising 4 series of chip bumps 302, 303, 304 and 305 having planary dimensions of 20 μm×20 μm, 20 μm×30 μm, 20 μm×40 μm and 20 μm×50 μm, respectively. The test kit is bonded with a simulated fixed array ACF comprising three hypothetical 45° stitching gaps 310, 320 and 340 having widths of 10 μm, 20 μm and 40 μm, respectively. In the illustration, no conductive particles are shown as being transferred to the gaps corresponding to the stitching lines 310, 320 and 340. It can be seen from FIG. 1b that there are IC bumps essentially free of any captured conductive particles even with the largest bump size 305 (20 μm×50 μm or 1000 μm²) for the stitching gaps 320 (20 μm gap) and 340 (40 μm gap). The best achievable resolution of the fixed array ACFs having a stitching line wider than 20 μm will be no better than 1000 μm². The resolution of the ACF with the stitching gap 310 (10 μm gap) is better but bumps with insufficient captured particles can still be observed for a bump smaller than 305 (1000 μm²), particularly for a bump smaller than 304 (800 μm²).

It is found that a stitching line width as narrow as 2-10 μm is required even with a high particle density (≥30,000 pcs/mm²) ACF having an oblique stitching line. However, making a durable and high resolution microcavity loop having such a narrow stitching line is extremely difficult and often results in particle aggregations in the subsequent microfluidic particle filling and transfer steps. The particle aggregation in turn result in undesirable shorts in the bonded devices.

FIG. 2 herein illustrates schematically an ACF that includes a first array of conductive particles 22 that are embedded in the ACF adhesive 24 a first distance (e.g., $d_1$) and a second array of conductive particles 26 that are embedded in the ACF a second but shallower distance (e.g., $d_2$) than the first particles 22. The pitch or the distance between adjacent particles in a particular array (i.e., the first array designated by the dotted hexagon 28 and the second array designated by the dotted hexagon 29) have the same pitch. The inset to FIG. 2 is a graph illustrating the distribution of embedment depth. This graph shows that the distribution is bimodal including two arrays of particles at distinctly different embedment depths ($d_1$ and $d_2$).

FIG. 3 illustrates a further embodiment from U.S. application Ser. No. 13/678,935 in which the ACF 40 includes a first array of particles 42 that are embedded in the ACF adhesive 44 at a first depth and a second array of particles 46 that are embedded in the ACF adhesive at a shallower depth. The ACF 40 in FIG. 3 is different from the ACF 20 illustrated in FIG. 2 in that the pitch of the particles making up the first and second arrays is different. The dotted line 48 illustrating the pitch of the second array of particles 46 is shorter than the dotted line 49 connecting adjacent particles 42 in the deeper first array of particles 42.

Figure 4:
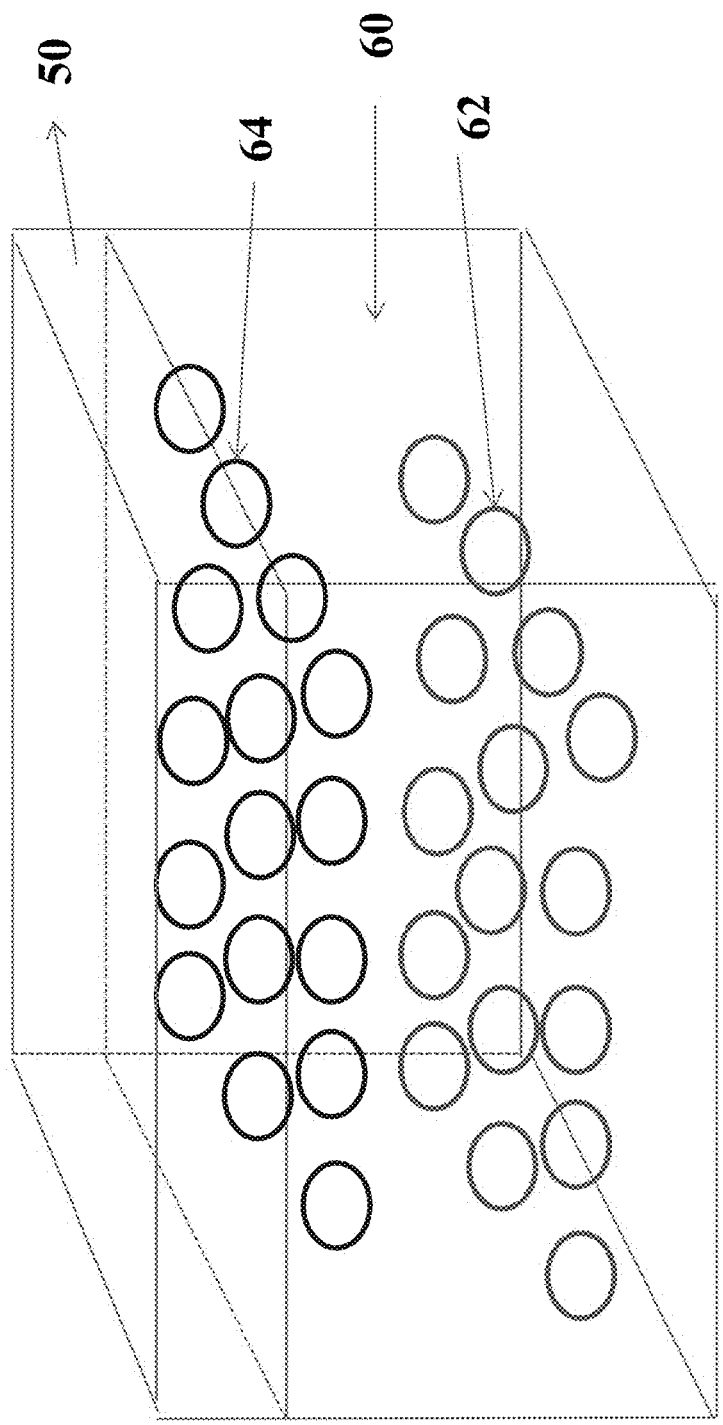
FIG. 4 is a schematic view of an ACF having a two tier fixed array including an optional overcoat.

The two-tier (or multi-tier) ACF is obtained by a transfer process using a continuous carrier belt having a stitching line as disclosed in U.S. application Ser. No. 13/233,360. The microcavity carrier belts may have the same or different microcavity patterns and pitch. Conductive particles are filled into the first microcavity belt and excess particles outside of the cavities are removed using, for example, a rubber wiper or a rubber roller with a carefully controlled gap and pressure or tension between the microcavity film and the wiper or roller. The conductive particles in the microcavity film are transferred to the epoxy adhesive by for example, laminating the filled microcavity film with the epoxy adhesive pre-coated on a release liner. As part of the laminating step or as a separate step, the thus transferred particles are or may be further pressed into adhesive film to allow from about 0% diameter (i.e., completely embedded) to 95% (i.e., partially embedded) exposed above the surface of the adhesive layer, (more particularly about 0% to 80% of the particle diameter exposed above the adhesive surface) by, for example, calendaring, laminating, or heating under pressure or shear. The particle filling and transfer processes are repeated with a second microcavity film to produce the two-tier or multi-tier particle morphology as illustrated in FIG. 4 where an optional overcoat adhesive 50 covering the top surface of the ACF 60 comprising the two-tier (62 and 64) particle morphology is also shown. Due to the stitching line, few (if any) particles in the first transfer are in the area of the stitching line. If the second transfer covers the entire area of the stitching line, the ACF includes a single layer of conductive particles at the stitching line and a double layer of conductive particles over the balance of the ACF.

Figure 5A:
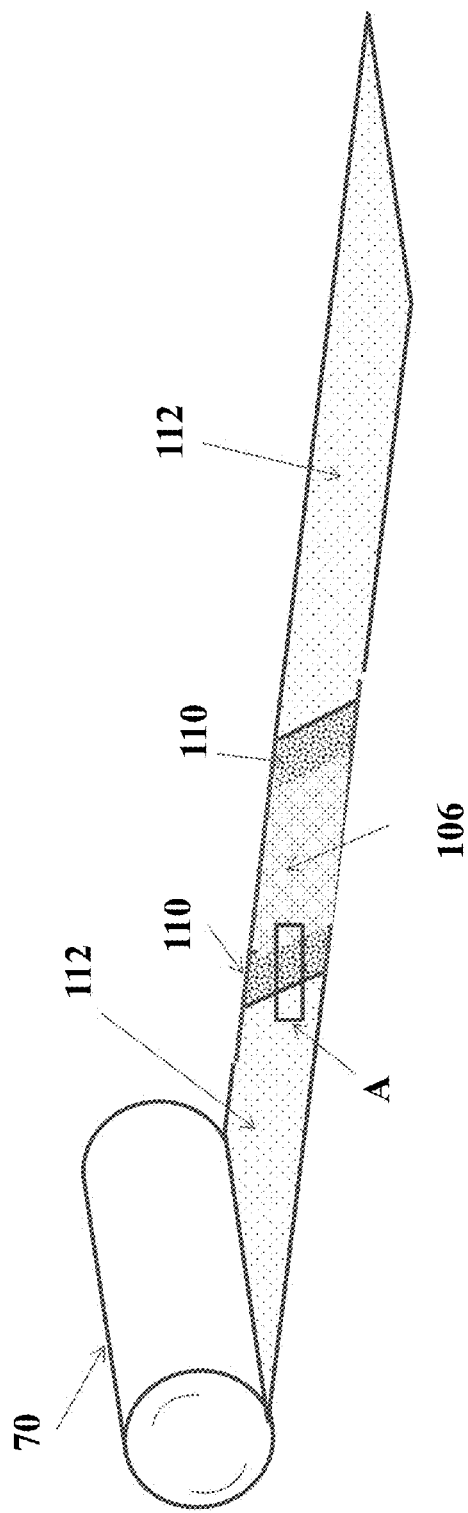
FIG. 5a is a schematic view of an ACF reel or roll with a microphotograph (FIG. 5c) showing a two tier structure of conductive particles in accordance with this disclosure wherein the second tier is transferred to the area of the stitching line and adjacent boundary areas.
Figure 5B:
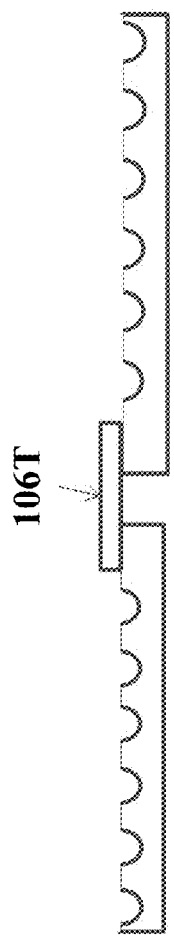
FIG. 5b is a schematic of a microcavity carrier belt stitched with, for example, a durable adhesive tape having a smooth surface.
Figure 5C:
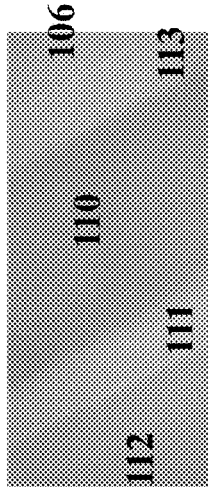

FIG. 5a is a schematic of an ACF roll or reel 70 comprising areas 112 having the 1$^{st}$ particle array, a stitching line area 106 having the 2$^{nd}$ tier particle array, and overlap areas 110 having both the 1$^{st}$ and the 2$^{nd}$ particle arrays. FIG. 5c is an optical microphotograph of the areas 112, 110 and 106 and the corresponding boundary areas 111 (left) and 113 (right) showing the transition of the two-tier structure outlined by the rectangle A in FIG. 5a. FIG. 5b shows the schematic of the stitching area of the microcavity carrier belt stitched with, for example, a durable adhesive tape 106T having a smooth surface to form a close loop. Conductive particles were filled into the microcavities and transferred onto an adhesive layer pre-coated on a release liner as described in U.S. application Ser. No. 13/233,360 to form an ACF comprising a particle-free stitching area 106 corresponding to the area covered by the stitching tape 106T, and areas having the 1$^{st}$ tier particles 112. The stitching line 106 is then overcoated by a second tier of conductive particles such that there is a continuous layer of conductive particles across the surface of the adhesive layer including the stitching line 106.

As further illustrated in the cross-sectional FIG. 6, an ACF comprising a substrate 100, a layer of an adhesive 102 on the surface of the substrate 100, the adhesive optionally having conductive particles dispersed therein, at least one tier of conductive particles 104 arranged in a non-random array, the tier being formed by transfer of conductive particles from a carrier belt having a stitching line to the surface of the adhesive layer wherein the portion of the surface of the adhesive layer corresponding to the stitching line 106 is overcoated with a second tier of conductive particles 108 arranged in a non-random array by transfer from a carrier belt that covers at least that portion 106 of the first tier corresponding to the stitching line. When the second transfer is selectively applied only in the area of the stitching line as shown in FIG. 6, the ACF includes a single layer of conductive particles with the particles outside the stitching line being applied in the first transfer and the particles in the area of the stitching line being applied in the second transfer. While FIG. 6 illustrates an embodiment in which the conductive particles are illustrated as fully embedded and at different depths, this disclosure includes ACF's in which the particles are partially embedded and/or at different depths. Further while only two tiers are shown, the disclosure includes embodiments in which 2, 3, 4, 5 or more tiers are present at the same or different depths.

FIG. 7 illustrates a further embodiment. If the second tier 108A is applied selectively over the area of the stitching line 106 and the overlap areas 110 adjacent to the stitching line, as shown in FIG. 7, the ACF includes a single layer of particles in the area of the stitching line 106, a double layer of particles in the areas 110 where the first transfer and the second transfer overlap and a single layer of particles 112 in the area of the first transfer outside the area of the stitching line.

In accordance with the further embodiment of the invention, the ACFs having any of the foregoing constructions is overcoated with a layer of adhesive 50 to improve tackiness or the attachment properties of the ACF to the electrode as shown in FIG. 4 wherein the adhesive 50 overcoat is deposited or laminated onto the conductive adhesive layer 60 including a first tier 62 and a second tier 64 of conductive particles. This adhesive can be the same as the adhesive on the surface of the ACF as discussed below in more detail. This overlayer adhesive does not require conductive particles but conductive particles may be included in the adhesive if desired.

In another embodiment, an ACF may be obtained by transferring one or more tiers of a fixed array of conductive particles onto an adhesive layer in which the conductive particles are randomly dispersed and fully embedded in the conductive adhesive layer. For example, as an alternative, a two-tier ACF can be prepared by forming an adhesive layer having conductive particles randomly dispersed in the adhesive and transferring to the surface of that ACF adhesive a fixed non-random arrays of particles and embedding those particles to the desired embedment depth in the adhesive layer as a first tier. Any of the conductive particles previously taught for use in ACFs may be used in practicing this disclosure. Gold coated particles are used in one embodiment. In one embodiment, the conductive particles have a narrow particle size distribution with a standard deviation of less than 10%, preferably less than 5%, even more preferably less than 3%. The particle size is preferably in the range of about 1 to 250 µm, more preferably about 2-50 µm, even more preferably about 2.5-10 µm. Two types of commercially available conductive particles that are useful in the invention are Ni/Au particles from Nippon Chemical through its distributor, JCI USA, in New York, a subsidiary of Nippon Chemical Industrial Co., Ltd., White Plains, N.Y. and the Ni particles from Inco Special Products, Wyckoff, N.J. In one embodiment the conductive particles may have a bimodal or a multimodal particle size distribution. In one embodiment the size of the microcavities and the conductive particles are selected so that each microcavity has a limited space to contain only one conductive particle. In a specific embodiment, the electrically conductive particle or microcavity having a diameter or depth in a range between about 1 to about 20 µm. In another embodiment, the electrically conductive particle or microcavity having a diameter or depth in a range between about 2 to about 5 µm. In another embodiment, the electrically conductive particle or microcavity having a diameter or depth with a standard deviation of less than about 10%.

In another preferred embodiment, the electrically conductive particle or microcavity has a diameter or depth with a standard deviation of less than about 5%. In another preferred embodiment, the adhesive layer comprises a thermoplastic, thermoset, or their precursors.

In one embodiment, conductive particles including a polymeric core and a metallic shell are used. Useful polymeric cores include but are not limited to, polystyrene, polyacrylates, polymethacrylates, polyvinyls, epoxy resins, polyurethanes, polyamides, phenolics, polydienes, polyolefins, aminoplastics such as melamine formaldehyde, urea formaldehyde, benzoguanamine formaldehyde and their oligomers, copolymers, blends or composites. If a composite material is used as the core, nanoparticles or nanotubes of carbon, silica, alumina, BN, $TiO_2$ and clay are preferred as the filler in the core. Suitable materials for the metallic shell include, but are not limited to, Au, Pt, Ag, Cu, Fe, Ni, Sn, Al, Mg and their alloys. Conductive particles having interpenetrating metal shells such as Ni/Au, Ag/Au, Ni/Ag/Au are useful for hardness, conductivity and corrosion resistance. Particles having rigid spikes such as Ni, carbon, graphite are useful in improving the reliability in connecting electrodes susceptible to corrosion by penetrating into the corrosive film if present. Such particles are available from Sekisui KK (Japan) under the trade name MICROPEARL, Nippon Chemical Industrial Co., (Japan) under the trade name BRIGHT, and Dyno A.S. (Norway) under the trade name DYNOSPHERES.

In another embodiment, the conductive particles may have a so called spiky surface. The spike might be formed by doping or depositing small foreign particles such as silica on the latex particles before the step of electroless plating of Ni followed by partial replacement of the Ni layer by Au. In one embodiment as explained in more detail in the aforementioned applications, the conductive particles are formed with spikes. These spikes may be formed as, without limitation, sharpened spikes, nodular, notches, wedges, or grooves. In another embodiment, the conductive particles may be pre-coated with a thin insulating layer, preferably an insulating polymer layer with a melt flow temperature near or lower than the bonding temperature.

Narrowly dispersed polymer particles may be prepared by, for example, seed emulsion polymerization as taught in U.S. Pat. Nos. 4,247,234, 4,877,761, 5,216,065 and the Ugelstad swollen particle process as described in Adv., Colloid Interface Sci., 13, 101 (1980); *J. Polym. Sci.*, 72, 225 (1985) and "Future Directions in Polymer Colloids", ed. El-Aasser and Fitch, p. 355 (1987), Martinus Nijhoff Publisher. In one embodiment, monodispersed polystyrene latex particle of about 5 µm diameter is used as a deformable elastic core. The particle is first treated in methanol under mild agitation to remove excess surfactant and to create microporous surfaces on the polystyrene latex particles. The thus treated particles are then activated in a solution comprising $PdCl_2$, HCl and $SnCl_2$ followed by washing and filtration with water to remove the $Sn^{4+}$ and then immersed in an electroless Ni plating solution (from for example, Surface Technology Inc, Trenton, N.J.) comprising a Ni complex and hydrophosphite at 90° C. for about 30 to about 50 minutes. The thickness of the Ni plating is controlled by the plating solution concentration and the plating temperature and time.

A release layer may be applied onto the microcavity to improve the transfer of the conductive particles onto the adhesive layer. The release layer may be selected from the list comprising fluoropolymers or oligomers, silicone oil, fluorosilicones, polyolefines, waxes, poly(ethyleneoxide), poly(propyleneoxide), surfactants with a long-chain hydrophobic block or branch, or their copolymers or blends. The release layer is applied to the surface of the microcavity array by methods including, but are not limited to, coating, printing, spraying, vapor deposition, plasma polymerization or cross-linking. As illustrated in the Liang '300 application, in another embodiment, the method further includes a step of employing a close loop of microcavity array. In another embodiment, the method further includes a step of employing a cleaning device to remove residual adhesive or particles from the microcavity array after the particle transfer step. In a different embodiment, the method further includes a step of applying a release layer onto the microcavity array before the particle filling step. In another embodiment, the conductive particles may be encapsulated or coated with a thermoplastic or thermoset insulating layer to further reduce the risk of short circuit in the X-Y plane as disclosed in U.S. Pat. Nos. 6,632,532; 7,291,393; 7,410,698; 7,566,494; 7,815,999; 7,846,547 and US Patent Applications 2006/0263581; 2007/0212521; and 2010/0327237. In accordance with one embodiment, the conductive particles are treated/coated with a coupling agent. The coupling agent enhances corrosion resistance of the conductive particles as well as the wet adhesion, or the binding strength in humid conditions, of the particles to electrodes having metal-OH or metal oxide moiety on the electrode surface, so that the conductive particles can be only partially embedded in the adhesive, such that they are readily accessible for bonding the electrical device. More importantly, the surface treated conductive particles can be better dispersed with a reduced risk of aggregation in the adhesive of the non-contact area or the spacing area among electrodes. As a result, the risk of short circuit in the X-Y plane is significantly reduced, particularly in the fine pitch applications.

Examples of useful coupling agents to pre-treat the conductive particles include titanate, zirconate and silane coupling agents ("SCA") such as organotrialkoxysilanes including 3-glycidoxypropyltrimethoxy-silane, 2-(3,4-epoxycyclohexyl)ethyltrimethoxysilane, gamma-mercaptopropyltrimethoxysilane, bis(3-triethoxysilylpropyl)tetrasulfide and bis(3-triethoxysilylpropyl)disulfide. The coupling agents containing thiol, disulfide, and tetrasulfide functional groups are particularly useful to pre-treat Au particles due to the formation of Au—S bond even in mild reaction conditions (See for example, *J. Am. Chem. Soc.,* 105, 4481 (1983) Adsorption of Bifunctional Organic Disulfides on Gold Surfaces.) The coupling agent may be applied to the surface of the conductive particle in an amount of about 5% to 100% of surface coverage, more particularly about 20% to 100% of surface coverage, even more particularly, 50% to 100% of surface coverage For references, see J. Materials Sci., Lett., 8 99], 1040 (1989); *Langmuir,* 9 (11), 2965-2973 (1993); Thin Solid Films, 242 (1-2), 142 (1994); Polymer Composites, 19 (6), 741 (1997); and "Silane Coupling Agents", $2^{nd}$ Ed., by E. P. Plueddemann, Plenum Press, (1991) and references therein.

The microcavity array may be formed directly on a carrier web or on a cavity-forming layer pre-coated on the carrier web. Suitable materials for the web include, but are not limited to polyesters such as polyethylene terephthalate (PET) and polyethylene naphthalate (PEN), polycarbonate, polyamides, polyacrylates, polysulfone, polyethers, polyimides, and liquid crystalline polymers and their blends, composites, laminates or sandwich films. A suitable material for the cavity-forming layer can include, without limitation, a thermoplastic material, a thermoset material or its precursor, a positive or a negative photoresist, or an inorganic material. To achieve a high yield of particle transfer, the carrier web may be preferably treated with a thin layer of release material to reduce the adhesion between the microcavity carrier web and the adhesive layer. The release layer may be applied by coating, printing, spraying, vapor deposition, thermal transfer, or plasma polymerization/crosslinking either before or after the microcavity-forming step. Suitable materials for the release layer include, but are not limited to, fluoropolymers or oligomers, silicone oil, fluorosilicones, polyolefines, waxes, poly(ethyleneoxide), poly(propyleneoxide), surfactants with a long-chain hydrophobic block or branch, or their copolymers or blends.

In one embodiment, particle deposition may be effected by applying a fluidic particle distribution and entrapping process, in which each conductive particle is entrapped into one microcavity. A number of entrapping processes can be used. For example, in one embodiment disclosed in Liang '700, a roll-to-roll continuous fluidic particle distribution process can be used to entrap only one conductive particle into each microcavity. The entrapped particles then can be transferred from the microcavity array to predefined locations on an adhesive layer. Typically, the distance between these transferred conductive particles must be greater than the percolation threshold, which is the density threshold at which the conductive particles aggregate.

The varieties of the patterns dimension, shapes and spacing of the microcavities are disclosed in US published patent applications Liang, US 2006/0280912 and Liang '700. The fixed array patterns may vary. In the case of circular microcavities, the pattern may be represented by X-Y where X is the diameter of the cavity and Y is the edge-to-edge distance between the adjacent cavities in microns. Typical microcavity pattern pitches include 4-3, 5-3, 5-5, 5-7, and 6-2 patterns. The pattern selected will depend in part on the number of particles required for each electrode. To reduce the minimum bonding space of electrodes, the microcavity pattern may be staggered.

Adopting the particle filling procedure described in the above example, a surface-treated polyimide (PI) microcavity sheet with a 6 (opening)×2 (spacing)×4 (depth) µm array configuration was filled with particles. An epoxy film was prepared with about 15 µm target thickness. The microcavity sheet and the epoxy film were affixed, face to face, on a steel plate. The steel plate was pushed through a HRL 4200 Dry-Film Roll Laminator, commercially available from Think & Tinker. The lamination pressure and lamination speed are adjusted such that this first array of particles is transferred from the microcavity carrier to the adhesive film with a good efficiency (greater than about 90%, preferably greater than about 95%) and with the desired embedment (for example about 40 to 90%) optionally with a post calendaring or heating process to allow a higher degree of embedment. A second array of particles is then transferred to the film and the lamination pressure and lamination speed are adjusted so as to obtain the desired degree of embedment. The transfer of the second fixed array of particles may, depending on conditions, further embed the first array of particles into the adhesive. The pressure, temperature and speed of the second array lamination are adjusted so that the first and second arrays are embedded in the epoxy adhesive to the desired different depths which are different for the first array and the second array of particles. By tiering the embedding depths in this fashion, an improved connection performance is achieved. In one embodiment, the first array is embedded about 40 to 90% of its particles' diameter and more typically about 50 to 80%. The second array is embedded about 10 to 60% of its particles' diameter and more typically about 30 to 60% provided that the percent embedment is greater for one array than the other array. In particular, it is desirable if the first array particles are embedded at least about 20%, preferably 30%, deeper into the adhesive relative to the embedment depth of the second array particles.

The adhesives used in the ACF may be thermoplastic, thermoset, or their precursors. Useful adhesives include but are limited to pressure sensitive adhesives, hot melt adhesives, heat or radiation curable adhesives. The adhesives may comprise for examples, epoxide, phenolic resin, amine-formaldehyde resin, polybenzoxazine, polyurethane, cyanate esters, acrylics, acrylates, methacrylates, vinyl polymers, rubbers such as poly(styrene-co-butadiene) and their block copolymers, polyolefins, polyesters, unsaturated polyesters, vinyl esters, polycaprolactone, polyethers, and polyamides. Epoxide, cyanate esters and multifunctional acrylates are particularly useful. Catalysts or curing agents including latent curing agents may be used to control the curing kinetics of the adhesive. Useful curing agents for epoxy resins include, but are not limited to, dicyanodiamide (DICY), adipic dihydrazide, 2-methylimidazole and its encapsulated products such as Novacure HX dispersions in liquid bisphenol A epoxy from Asahi Chemical Industry, amines such as ethylene diamine, diethylene triamine, triethylene tetraamine, BF3 amine adduct, Amicure from Ajinomoto Co., Inc, sulfonium salts such as diaminodiphenyl-sulphone, p-hydroxyphenyl benzyl methyl sulphonium hexafluoroantimonate. In one embodiment the particles may be coated with a coupling agent. Coupling agents including, but are not limited to, titanate, zirconate and silane coupling agents such as glycidoxypropyl trimethoxysilane and 3-aminopropyl trimethoxy-silane may also be used to improve the durability of the ACF. A discussion of the effect of curing agents and coupling agents on the performance of epoxy-based ACFs can be found in S. Asai, et al, J. Appl. Polym. Sci., 56, 769 (1995). The entire paper is hereby incorporated by reference in its entirety. The dry adhesive thickness is typically in the range of 5-30 μm, preferably in the range of 10-20 μm.

Fluidic assembly of IC chips or solder balls into recess areas or holes of a substrate or web of a display material has been disclosed in for example, U.S. Pat. Nos. 6,274,508, 6,281,038, 6,555,408, 6,566,744 and 6,683,663. Filling of top-sealing of electrophoretic or liquid crystal fluids into the microcups of an embossed web is disclosed in for example, U.S. Pat. Nos. 6,672,921, 6,751,008, 6,784,953, 6,788,452, and 6,833,943. Preparation of abrasive articles having precise spacing by filling into the recesses of an embossed carrier web, an abrasive composite slurry comprising a plurality of abrasive particles dispersed in a hardenable binder precursor was also disclosed in for example, U.S. Pat. Nos. 5,437,754, 5,820,450 and 5,219,462. All of the aforementioned United States patents are hereby incorporated by reference in their respective entirety. In the above-mentioned art, recesses, holes, or microcups were formed on a substrate by for example, embossing, stamping, or lithographic processes. A variety of devices were then filling into the recesses or holes for various applications including active matrix thin film transistors (AM TFT), ball grid arrays (BGA), electrophoretic and liquid crystal displays. In a particular embodiment an ACF is formed by fluidic filling of only one conductive particle in each microcavity or recess and the conductive particles comprising a polymeric core and a metallic shell and as taught in US patent applications 20150072109, 20120295098 and references therein, the metallic shell is encapsulated with an insulation polymer or coated with a coupling agent and more particularly a silane coupling agent and the particle is partially embedded in the ACF adhesive layer.

The microcavities may be formed directly on a plastic web substrate with, or without, an additional cavity-forming layer. Alternatively, the microcavities may also be formed without an embossing mold, for example, by laser ablation or by a lithographic process using a photoresist, followed by development, and optionally, an etching or electroforming step. Suitable materials for the cavity forming layer can include, without limitation, a thermoplastic, a thermoset or its precursor, a positive or a negative photoresist, or an inorganic or a metallic material. As to laser ablating, one embodiment generates an excimer laser beam for ablation having power in the range of between about 0.1 W/cm$^2$ to about 200 W/cm$^2$ or more employing a pulsing frequency being between about 0.1 Hz to about 500 Hz; and applying between about 1 pulse to about 100 pulses. In a preferred embodiment, laser ablation power is in the range of between about 1 W/cm$^2$ to about 100 W/cm$^2$, employing a pulsing frequency of between about 1 Hz to about 100 Hz, and using between about 10 pulses to about 50 pulses. It also is desirable to apply a carrier gas with vacuum, to remove debris.

To enhance transfer efficiency, the diameter of the conductive particles and the diameter of the cavities have specific tolerance. To achieve a high transfer rate, the diameter of the cavities preferably have specific tolerance less than about 5% to about 10% standard deviation requirement is based on the rationales set forth in U.S. Patent Publication 2010/0101700.

In an embodiment, particles in a non-random ACF microcavity array can have a particle size range distributed about a single mean particle size value, typically between about 2 μm to about 6 μm, with embodiments featuring a narrow distribution including a narrow particle size distribution having a standard deviation of less than about 10% from the mean particle size. In other embodiments featuring a narrow distribution, a narrow particle size distribution may be preferred to have a standard deviation of less than about 5% from the mean particle size. Typically, a cavity of a selected cavity size is formed to accommodate a particle having a selected particle size that is slightly smaller than the selected cavity size. To avoid the formation of particle cluster in the ACF, preferably the average diameter of the cavity opening is slightly larger than the particle diameter but is smaller than two times of the particle diameter. More preferably, the average diameter of the cavity opening is larger than 1.5 times of the particle diameter but is smaller than two times of the particle diameter.

Thus, in one embodiment, microcavities in a non-random ACF microcavity array can have a cavity size range distributed about a single mean cavity size value, typically between about 2 μm to about 6 μm, with embodiments featuring a narrow distribution including a narrow cavity size distribution having a standard deviation of less than 10% from the mean cavity size. In other embodiments featuring a narrow distribution, a narrow cavity size distribution may be preferred to have a standard deviation of less than 5% from the mean cavity size.

In a specific embodiment, the invention further discloses a method for fabricating an electronic device. The method includes a step of placing a plurality of electrically conductive particles that include an electrically conductive shell surface-treated or coated with a coupling agent or insulating layer and a core material into an array of microcavities followed by overcoating or laminating an adhesive layer onto the filled microcavities. In a one embodiment, the step of placing a plurality of surface treated conductive particles into an array of microcavities comprises a step of employing a fluidic particle distribution process to entrap each of the conductive particles into a single microcavity.

According to above descriptions, drawings and examples, this invention discloses an anisotropic conductive film (ACF) that includes a plurality of electrically conductive surface treated particles disposed in predefined two-tiered non-random particle locations as a non-random fixed array in an adhesive layer wherein the non-random particle locations corresponding to a plurality of predefined microcavity locations of arrays of microcavities for carrying and transferring the electrically conductive particles to the adhesive layer. The conductive particles are transferred sequentially in a first and then second array to an adhesive layer where they are embedded at different depths.

In addition to the above embodiment, this invention further discloses an electronic device with electronic components connected with an ACF of this invention. In a particular embodiment, the electronic device comprises a display device. In another embodiment, the electronic device comprises a semiconductor chip. In another embodiment, the electronic device comprises a printed circuit board with printed wire. In another preferred embodiment, the electronic device comprises a flexible printed circuit board with printed wire.

Having described the invention in detail and by reference to specific embodiments thereof, it will be apparent that numerous variations and modifications are possible without departing from the scope of the invention as defined by the following claims.

What is claimed is:

1. An ACF comprising a substrate, a layer of an adhesive on the surface of the substrate, a first tier of conductive particles arranged in a non-random array partially embedded in a surface of the adhesive layer, the first tier being formed by transfer of conductive particles from a carrier belt having a stitching line to the surface of the adhesive layer, the portion of the first tier corresponding to the stitching line being free of or being essentially free of conductive particles, and a second tier of conductive particles arranged in a non-random array partially embedded in the surface of the same surface of the adhesive layer as the first tier of conductive particles and the second tier overcoating the portion of the first tier corresponding to the stitching line so as to provide conductive particles in the area of the stitching line wherein the depths of the partially embedded first and second tiers of conductive particles are distinctly different.

2. The ACF of claim 1 wherein at least about 10% of the partially embedded conductive particles, based on the diameter of the particles, in the first or the second array is exposed above the surface of the adhesive layer.

3. The ACF of claim 2 wherein at least about 30% of the partially embedded particles is exposed above the surface of the adhesive layer.

4. The ACF of claim 1 wherein in addition to the particles in the first and second tiers, the adhesive layer contains conductive particles dispersed therein.

5. The ACF of claim 4 wherein the ACF is obtained by transferring the first tier of a fixed array of conductive particles onto the surface of the adhesive layer in an ACF except in the area of the stitching line and transferring a second tier of a fixed array of conductive particles to the surface layer of the adhesive layer in the ACF at least in the area of the stitching line.

6. The ACF of claim 4 wherein the ACF further comprises a separate non-conductive adhesive layer overlying the tiers of conductive particles.

7. The ACF of claim 1 wherein adhesive layer has orthogonal X and Y directions and the particles in a fixed non-random array have a pitch of about 3 to 30 μm in the X and/or Y direction.

8. The ACF of claim 7 wherein the particle sites are arranged in an array having a pitch of about 4 to 12 μm in the X and/or Y direction.

9. The ACF of claim 2 wherein the first and second tiers at least partially overlap.

10. The ACF of claim 9 wherein the adhesive layer is about 5 to 30 μm thick.

11. The ACF of claim 10 wherein the adhesive layer is about 10 to 25 μm thick.

* * * * *